(12) United States Patent
Tsukikawa (10) Patent No.: US 6,735,133 B1
(45) Date of Patent: May 11, 2004

(54) SEMICONDUCTOR MEMORY CIRCUIT HAVING NORMAL OPERATION MODE AND BURN-IN TEST MODE

(75) Inventor: Yasuhiko Tsukikawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/459,624

(22) Filed: Jun. 12, 2003

(30) Foreign Application Priority Data

Nov. 14, 2002 (JP) .................................. P2002-330850

(51) Int. Cl.[7] .............................................. G11C 29/00
(52) U.S. Cl. ......................... 365/201; 365/63; 365/203
(58) Field of Search .......................... 365/201, 63, 203, 365/205

(56) References Cited

U.S. PATENT DOCUMENTS

| | | | |
|---|---|---|---|
| 5,654,924 A | 8/1997 | Suzuki et al. | |
| 5,995,427 A | 11/1999 | Tsukikawa | |
| 6,005,815 A | 12/1999 | Nakano | |
| 6,317,368 B1 * | 11/2001 | Taito et al. ................. | 365/201 |
| 6,337,820 B1 | 1/2002 | Hatakeyama | |
| 6,373,764 B2 | 4/2002 | Fujioka | |
| 6,490,221 B2 * | 12/2002 | Furutani et al. ............ | 365/203 |
| 6,631,092 B2 * | 10/2003 | Yamasaki ................... | 365/201 |

FOREIGN PATENT DOCUMENTS

| | | |
|---|---|---|
| JP | 04-53099 | 2/1992 |
| JP | 09-63297 | 3/1997 |
| JP | 10-233100 | 9/1998 |
| JP | 10-340598 | 12/1998 |
| JP | 11-120794 | 4/1999 |
| JP | P2001-176296 A | 6/2001 |
| JP | P2001-243794 A | 9/2001 |

* cited by examiner

*Primary Examiner*—Huan Hoang
(74) *Attorney, Agent, or Firm*—McDermott, Will & Emery (57) ABSTRACT

In a semiconductor memory circuit including a memory cell array and first and second sense amplifier circuits provided at opposite sides of the memory cell array, respectively and having a plurality of first sense amplifiers and a plurality of second sense amplifiers, respectively, a first bit line and sense amplifier interconnecting circuit, a first bit line equalizing circuit and a first short-circuiting transistor circuit are provided between the memory cell array and the first sense amplifier circuit, while a second bit line and sense amplifier interconnecting circuit, a second bit line equalizing circuit and a second short-circuiting transistor circuit are provided between the memory cell array and the second sense amplifier circuit. Each of the first and second sense amplifiers is formed by a first transistor having a first gate insulation film, while each of the first and second bit line and sense amplifier interconnecting circuits, the first and second bit line equalizing circuits and the first and second short-circuiting transistor circuits is formed by a second transistor having a second gate insulation film thicker than the first gate insulation film.

3 Claims, 6 Drawing Sheets

SEMICONDUCTOR MEMORY CIRCUIT HAVING NORMAL OPERATION MODE AND BURN-IN TEST MODE

BACKGROUND OF THE INVENTION

1. Field of the Invention

The present invention relates to a burn-in test circuit for screening a chip having a potential defect leading to an initial defect, by applying a voltage higher than that in a normal operation mode to a memory cell in a semiconductor memory circuit, especially, a DRAM chip.

2. Description of the Prior Art

Figure 4:
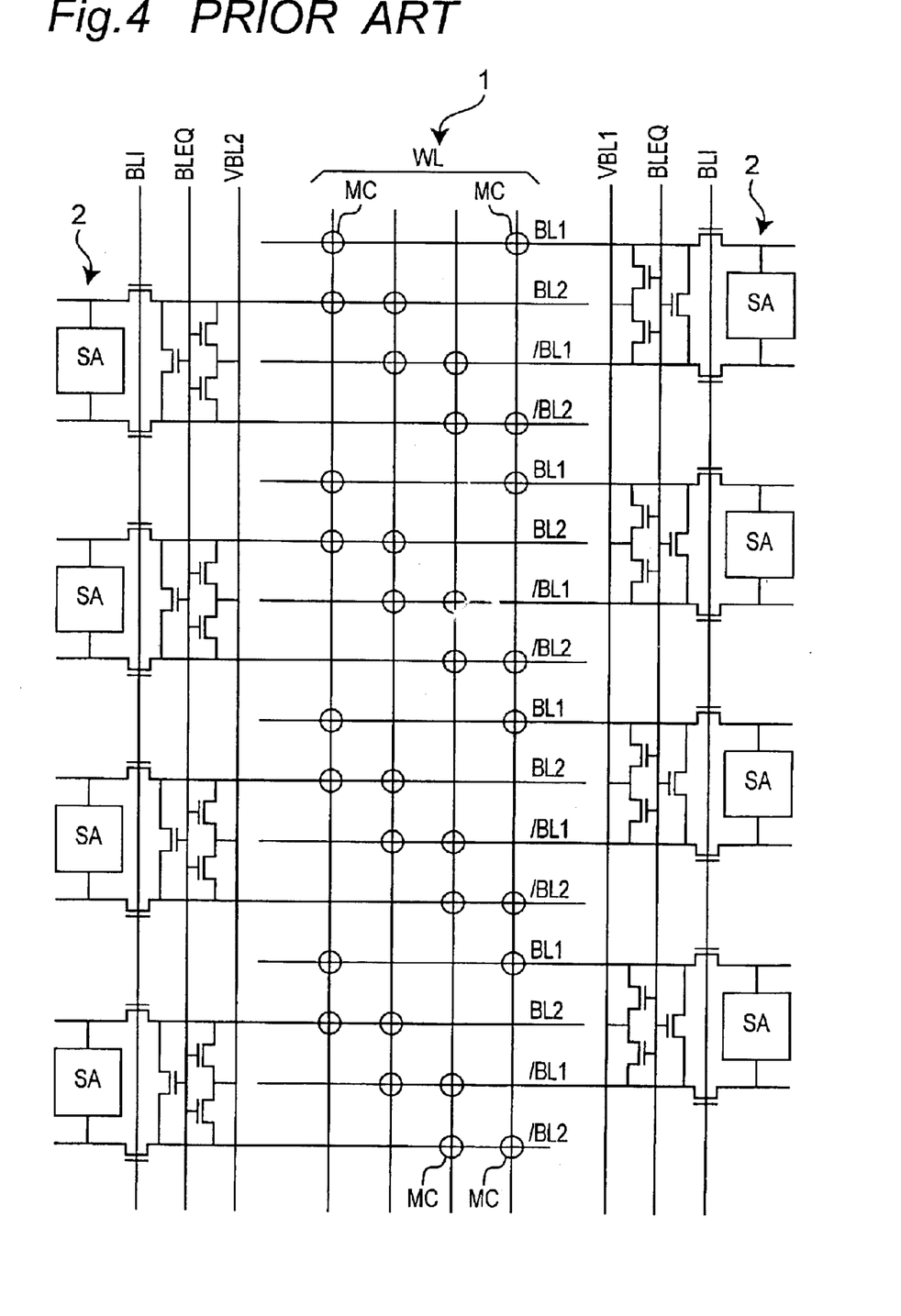
FIG. 4 is a circuit diagram showing a configuration of a prior art semiconductor memory circuit.

FIG. 4 shows a configuration of a conventional semiconductor memory circuit. The conventional semiconductor memory circuit includes a memory cell array having a plurality of memory cells MC arranged in a matrix. Bit line pair BL1 and /BL1 and bit line pair BL2 and /BL2 are provided in rows of the matrix, while a plurality of word lines WL are provided in columns of the matrix. The memory cells MC are disposed at points of intersection of the bit lines and the word line WL. Each of the memory cells MC is a DRAM memory cell including one transistor and one capacitor.

A sense amplifier circuit 2 including a plurality of sense amplifiers SA is provided at each of opposite sides of the memory cell array 1. The sense amplifiers SA disposed at the right side of the memory cell array 1 are connected to the bit line pair BL1 and /BL1 so as to amplify a minute potential difference between the bit line pair BL1 and /BL1, while the sense amplifiers SA disposed at the left side of the memory cell array 1 are connected to the bit line pair BL2 and /BL2 so as to amplify a minute potential difference between the bit line pair BL2 and /BL2.

As described in, for example, Japanese Patent Laid-Open Publication No. 10-340598 (1998), the memory cell array 1 of the conventional semiconductor memory circuit in FIG. 4 has a so-called quarter pitch cell arrangement in which the bit line pair BL1 and /BL1 and the bit line pair BL2 and /BL2 are combined with each other telescopically in a direction of the word lines WL such that a plurality of sets each having the bit lines BL1, BL2, /BL1 and /BL2 arranged sequentially are repeated.

A bit line equalizing circuit BLEQ and a bit line and sense amplifier interconnecting circuit BLI are provided between the sense amplifier circuit 2 and the memory cell array 1. The bit line equalizing circuit BLEQ functions to set the bit line pair to an identical potential during standby. In FIG. 4, two potentials VBL1 and VBL2 are provided as described in, for example, Japanese Patent Laid-Open Publication No. 2001-243794 (2001).

In a normal operation mode, the potentials VBL1 and VBL2 are set to be equal to each other. Each sense amplifier circuit 2 is shared by a pair of the bit line and sense amplifier interconnecting circuits BLI provided on its both sides and this is referred to as a "shared sense amplifier configuration". At the time of activation of the word lines WL, the bit line and sense amplifier interconnecting circuit BLI is used for isolating one of the opposite bit line pairs of the respective sense amplifier circuits 2 from the corresponding sense amplifier circuit 2 so as to reduce stray capacity of the bit lines.

In order to secure reliability of the memory cells, a burn-in test in which a chip having a potential defect leading to an initial defect is screened by applying a voltage higher than that in the normal operation mode to the memory cells is performed prior to the shipment. The chip found to be defective by the burn-in test is replaced by an accepted chip and is discarded as a defective product so as to be rejected before the shipment. Rate for detecting the potential defect by the burn-in test is referred to as "burn-in acceleration". The burn-in acceleration depends on a voltage applied in the burn-in test. Naturally, as the burn-in voltage is higher, the burn-in acceleration is higher. Meanwhile, as the burn-in period is longer, detection of the potential defect progresses further. Therefore, in order to heighten the burn-in effect, it is desirable that the burn-in test is performed at as high a voltage as possible for as long a time as possible. However, if the burn-in period is long, productivity deteriorates, so that the burn-in test is economically performed at such a high voltage as not to bring about breakdown of a transistor or the like.

The bit line equalizing circuits BLEQ are employed for applying a voltage stress among the neighboring bit lines BL1, BL2, /BL1 and /BL2 in the memory cell array 1 in the quarter pitch cell arrangement of FIG. 4 so as to perform the burn-in test. Namely, if the potentials VBL1 and VBL2 are, respectively, set to high level and low level by setting a signal of the bit line equalizing Circuits BLEQ to high level, the bit line pair BL1 and /BL1 are set to high level. On the other hand, since the bit line pair BL2 and /BL2 are set to low level, the voltage stress can be applied among the neighboring bit lines BL1, BL2, /BL1 and /BL2.

On the contrary, if the potentials VBL1 and VBL2 are, respectively, set to low level and high level, the bit line pair BL1 and /BL1 are set to low level and the bit line pair BL2 and /BL2 are set to high level. Therefore, by setting to different values the potentials VBL1 and VBL2 equal to each other in the normal operation mode, the voltage stress can be applied among the neighboring bit lines BL1, BL2, /BL1 and /BL2.

Figure 5:
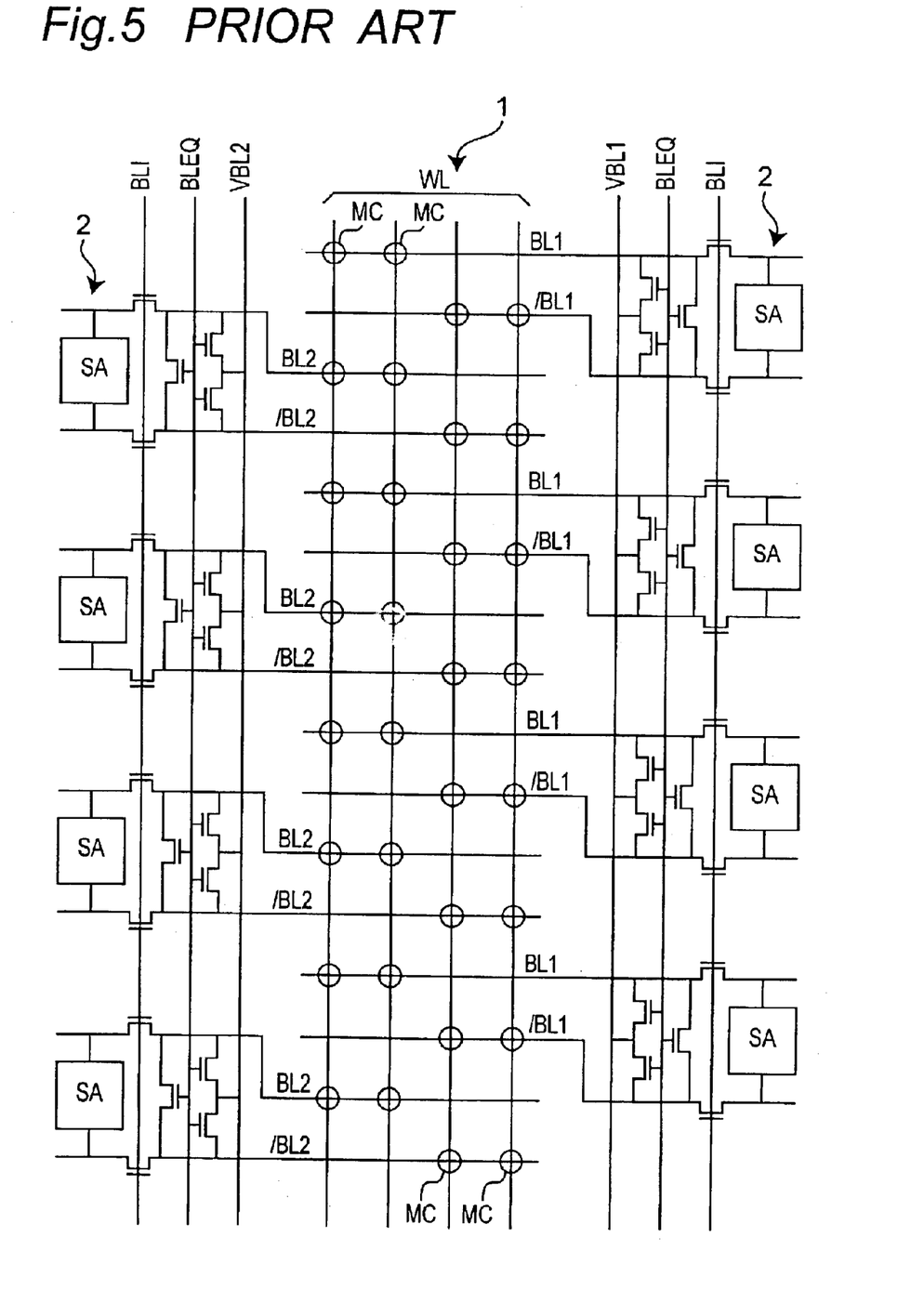
FIG. 5 is a circuit diagram showing a configuration of another prior art semiconductor memory circuit.

FIG. 5 shows a configuration of another known semiconductor memory circuit. As described in, for example, Japanese Patent Laid-Open Publication No. 10-340598 (1998) referred to above, the memory cell array 1 of FIG. 5 has a so-called half pitch cell arrangement in which the bit line pair BL1 and /BL1 and the bit line pair BL2 and /BL2 are provided alternately in the direction of the word lines WL such that a plurality of sets each having the bit lines BL1, /BL1, BL2 and /BL2 arranged sequentially are repeated. A decision as to which one of the memory cell array 1 of the quarter pitch cell arrangement in FIG. 4 and the memory cell array 1 of the half pitch cell arrangement in FIG. 5 should be selected is made based on various factors, mainly, feasibility of microfabrication of the memory cells and feasibility for optimizing current driving force of a transistor in the memory cell.

Also in the known semiconductor memory circuit of FIG. 5, a voltage stress can be applied among the neighboring bit lines by using the bit line equalizing circuits BLEQ in the same manner as the conventional semiconductor memory circuit of FIG. 4. Namely, if the potentials VBL1 and VBL2 are, respectively, set to high level and low level by setting a signal of the bit line equalizing circuits BLEQ to high level, the bit line pair BL1 and /BL1 are set to high level and the bit line pair BL2 and /BL2 are set to low level. Therefore, the voltage stress can be applied between the bit lines /BL1 and BL2 and between the bit lines /BL2 and BL1.

Figure 6:
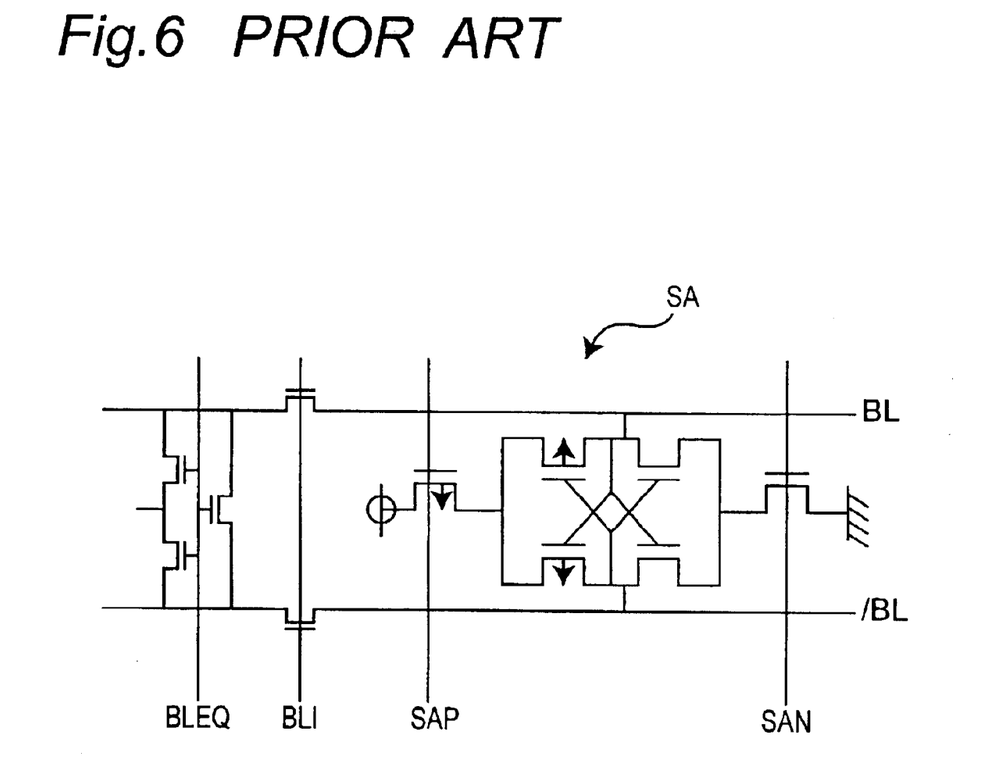
FIG. 6 is a circuit diagram showing a configuration of a sense amplifier employed in the prior art semiconductor memory circuit of FIG. 5.

On the contrary, if the potentials VBL1 and VBL2 are, respectively, set to low level and high level, the bit line pair BL1 and /BL1 are set to low level and the bit line pair BL2 and /BL2 are set to high level. Therefore, the voltage stress can be applied between the bit lines /BL1 and BL2 and between the bit lines /BL2 and BL1. In the example shown in FIG. 5, the voltage stress cannot be applied between the neighboring bit lines BL1 and /BL1 and between the neighboring bit lines BL2 and /BL2. Hence, also in the memory cell array 1 of the half pitch cell arrangement in FIG. 5, it is necessary to apply the voltage stress between the neighboring bit lines BL1 and /BL1 and between the neighboring bit lines BL2 and /BL2. To this end, the sense amplifier SA should be activated at a potential corresponding to the voltage stress to be applied. FIG. 6 is a circuit diagram of the sense amplifier SA. By setting sense amplifier activating signals SAP and SAN to low level and high level, respectively, the bit line pair BL and /BL are, respectively, set to high level and low level or low level and high level, so that the voltage stress can be applied between the bit line pair BL and /BL. If a supply potential fed to the sense amplifier SA is raised as high as in the burn-in test, a potential between the bit line pair BL and /BL also increases, so that the burn-in test can be performed.

In recent years, operating voltages of DRAMs are on the downward trend. For example, a former standard synchronous DRAM (SDRAM) has an operating voltage of 3.3 V. However, a double data rate (DDR) type DRAM in current use predominantly has an operating voltage of 2.5 V. In addition, a double data rate-II (DDR-II) type DRAM considered to be used predominantly in future has an operating voltage of 1.8 V. A purpose for lowering the operating voltage of the DRAM year by year is to lower an operating current of the DRAM and to reduce electromagnetic noises in high-speed operation.

However, the DDR-II type DRAM has an operating frequency of not less than 400 MHz. Therefore, in case the DDR-II type DRAM is operated at such a high speed by a supply voltage of 1.8 V, it is essential to upgrade driving capability of transistors used in the circuit. Actually, in the DDR-II type DRAM, transistors having a dielectric film thinner than those of the memory cells are used for a control circuit or a data processing circuit in the chip so as to obtain a high driving force at the low voltage.

Thus, in the prior art semiconductor memory circuits, the transistors of the sense amplifier are formed by thin film transistors, while the transistors of the DDR-II type DRAM memory cells, the transistors of the bit line equalizing circuits and the bit line and sense amplifier interconnecting circuit are formed by thick film transistors, so that the thin film transistors and the thick film transistors are provided mixedly. In this case, when the burn-in test is performed by raising as high as in the burn-in test the supply potential fed to the sense amplifier SA of FIG. 6, a problem arises.

Namely, in the sense amplifier SA, a threshold voltage is set to be low so as to detect at a low voltage a minute potential difference between the bit line pair. However, in order to restrict cut-off leakage current to a small value at the low threshold voltage, the transistors of the sense amplifier SA are desirably formed by the thin film transistors. Thus, if the transistors of the sense amplifier SA are formed by the thin film transistors, breakdown of the sense amplifier SA happens when the voltage of the sense amplifier SA is raised. Therefore, it is impossible to raise the voltage of the sense amplifier SA.

For example, supposing that thickness of an oxide film of the thick film transistor is set to 6.5 nm, thickness of an oxide film of the thin film transistor is set to 3.5 nm and an electric field stress applied to the oxide film in the burn-in test is 8 MV/cm, a potential difference of 5.2 V can be applied to the thick film transistor but merely a potential difference of 2.8 V can be applied between the bit line pair connected to the sense amplifier, so that burn-in acceleration is low.

SUMMARY OF THE INVENTION

Accordingly, an essential object of the present invention is to provide, with a view to eliminating the above mentioned drawbacks of prior art a semiconductor memory circuit which is capable of performing a burn-in test by applying a high potential difference between bit line pair even in case a thin film transistor is used for a sense amplifier.

In order to accomplish this object of the present invention, a semiconductor memory circuit having a normal operation mode and a burn-in test mode, according to the present invention includes a memory cell array which includes a plurality of memory cells arranged in a matrix, a plurality of bit lines provided in rows of the matrix and a plurality of word lines provided in columns of the matrix. First and second sense amplifier circuits are, respectively, provided at opposite sides of the memory cell array in a direction of the bit lines and include a plurality of first sense amplifiers each connected to first bit line pair in the bit lines and a plurality of second sense amplifiers each connected to second bit line pair in the bit lines, respectively. First and second bit line and sense amplifier interconnecting circuits couple the first and second bit line pairs to the first and second sense amplifier circuits, respectively. First and second bit line equalizing circuits set the first and second bit line pairs to first and second identical potentials, respectively during standby. A first short-circuiting transistor circuit couples first and second potentials to the first bit line pair, while a second short-circuiting transistor circuit couples third and fourth potentials to the second bit line pair. The first bit line and sense amplifier interconnecting circuit, the first bit line equalizing circuit and the first short-circuiting transistor circuit are provided between the memory cell array and the first sense amplifier circuit, while the second bit line and sense amplifier interconnecting circuit, the second bit line equalizing circuit and the second short-circuiting transistor circuit are provided between the memory cell array and the second sense amplifier circuit such that the first and second short-circuiting transistor circuits are, respectively, disposed more adjacent to the memory cell array than the first and second bit line and sense amplifier interconnecting circuits are. Each of the first and second sense amplifiers is formed by a first transistor having a first gate insulation film, while each of the first and second bit line and sense amplifier interconnecting circuits, the first and second bit line equalizing circuits and the first and second short-circuiting transistor circuits is formed by a second transistor having a second gate insulation film thicker than the first gate insulation film.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

(First Embodiment)

Figure 1:
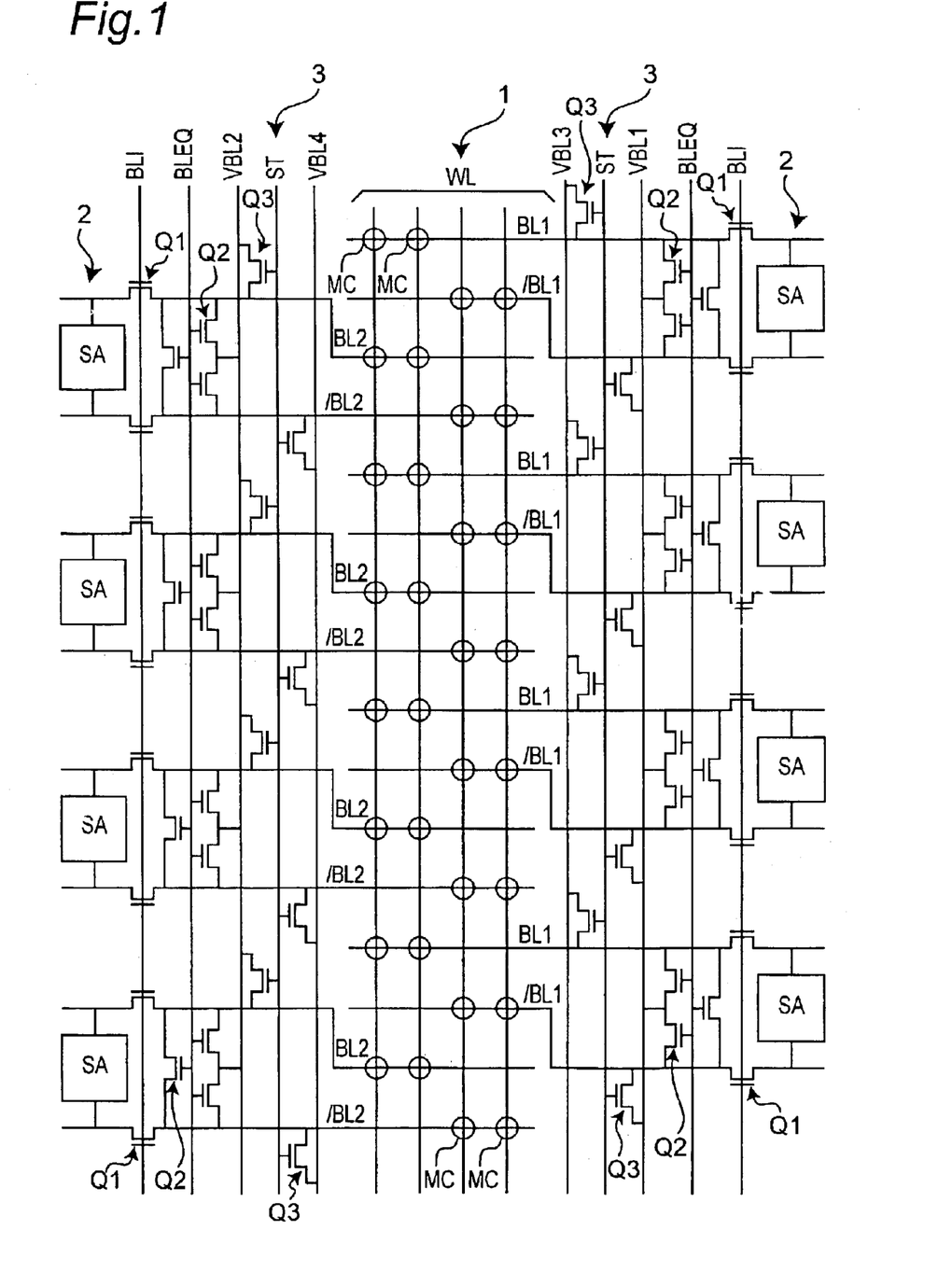
FIG. 1 is a circuit diagram showing a configuration of a semiconductor memory circuit according to a first embodiment of the present invention.

FIG. 1 shows a configuration of a semiconductor memory circuit having a normal operation mode and a burn-in test mode, according to a first embodiment of the present invention. This semiconductor memory circuit includes a memory cell array having a plurality of memory cells MC arranged in a matrix. Before pair BL1 and /BL1 and bit line pair BL2 and /BL2 are provided in rows of the matrix, while a plurality of word lines WL are provided in columns of the matrix. The memory cells MC are disposed at points of intersection of the bit lines and the word lines WL. Each of the memory cells MC is constituted by one transistor and one capacitor.

In FIG. 1, the memory cell array 1 has a half pitch cell arrangement in which the bit line pair BL1 and /BL1 and the bit line pair BL2 and /BL2 are provided alternately in a direction of the word lines WL such that a plurality of sets each having the bits lines BL1, /BL1, BL2 and /BL2 arranged sequentially are repeated.

In the semiconductor memory circuit of FIG. 1, a sense amplifier circuit 2 having a plurality of sense amplifiers SA, a bit line and sense amplifier interconnecting circuit BLI having a plurality of transistors Q1, a bit line equalizing circuit BLEQ having a plurality of transistors Q2 and a short-circuiting transistor circuit 3 having a plurality of short-circuiting transistors Q3 are further provided at each of opposite sides of the memory cell array 1 sequentially in a direction towards the memory cell array 1. In response to a short circuit signal ST, the short-circuiting transistors Q3 of the short-circuiting transistor circuit 3 short-circuit the bit lines to potentials VBL1, VBL2, VBL3 and VBL4. Namely, the bit lines BL1, BL2, /BL1 and /BL2 are, respectively, connected to the potentials VBL3, VBL2, VBL1 and VBL4 via the short-circuiting transistors Q3.

The sense amplifiers SA disposed at the right side of the memory cell array 1 are connected to the bit line pair BL1 and /BL1 so as to amplify a minute potential difference between the bit line pair BL1 and /BL1, while the sense amplifiers SA disposed at the left side of the memory cell array 1 are connected to the bit line pair BL2 and /BL2 so as to amplify a minute potential difference between the bit line pair BL2 and /BL2. The bit line equalizing circuit BLEQ functions to set the bit line pair to an identical potential. Meanwhile, at the time of activation of the word lines WL, the bit line and sense amplifier interconnecting circuit BLI is used for isolating one of the opposite bit line pairs of the respective sense amplifier circuits 2 from the corresponding sense amplifier circuit 2 so as to reduce stray capacity of the bit lines.

In the semiconductor memory circuit of FIG. 1, the sense amplifiers SA of the sense amplifier circuit 2 are formed by thin film transistors, while the transistors Q1 of the bit line and sense amplifier interconnecting circuit BLI, the transistors Q2 of the bit line equalizing circuit BLEQ and the short-circuiting transistors Q3 of the short-circuiting transistor circuit 3 are formed by thick film transistors.

Hereinafter, a method of performing burn-in by applying a high voltage stress among the bit lines in the semiconductor memory circuit of the above configuration is described. In the burn-in test mode, a signal of the bit line and sense amplifier interconnecting circuit BLI is set to low level so as to electrically isolate the sense amplifier SA and the bit lines from each other. Then, the potentials VBL1 and VBL4 are set to high level and the potentials VBL2 and VBL3 are set to low level and the short circuit signal ST is set to high level. Thus, since the bit lines BL1 and BL2 are, respectively, connected to the low-level potential VBL3 and the low-level potential VBL2, while the bit lines /BL1 and /BL2 are, respectively, connected to the high-level potential VBL1 and the high-level potential VBL4, the voltage stress can be applied among the neighboring bit lines BL1, /BL1, BL2 and /BL2.

Similarly, the potentials VBL1 and VBL4 are set to low level and the potentials VBL2 and VBL3 are set to high level and the short circuit signal ST is set to high level. Thus, since the bit lines BL1 and BL2 are, respectively, connected to the high-level potential VBL3 and the high-level potential VBL2, while the bit lines /BL1 and /BL2 are, respectively, connected to the low-level potential VBL1 and the low-level potential VBL4, the voltage stress can be applied among the neighboring bit lines BL1, /BL1, BL2 and /BL2.

Figure 2:
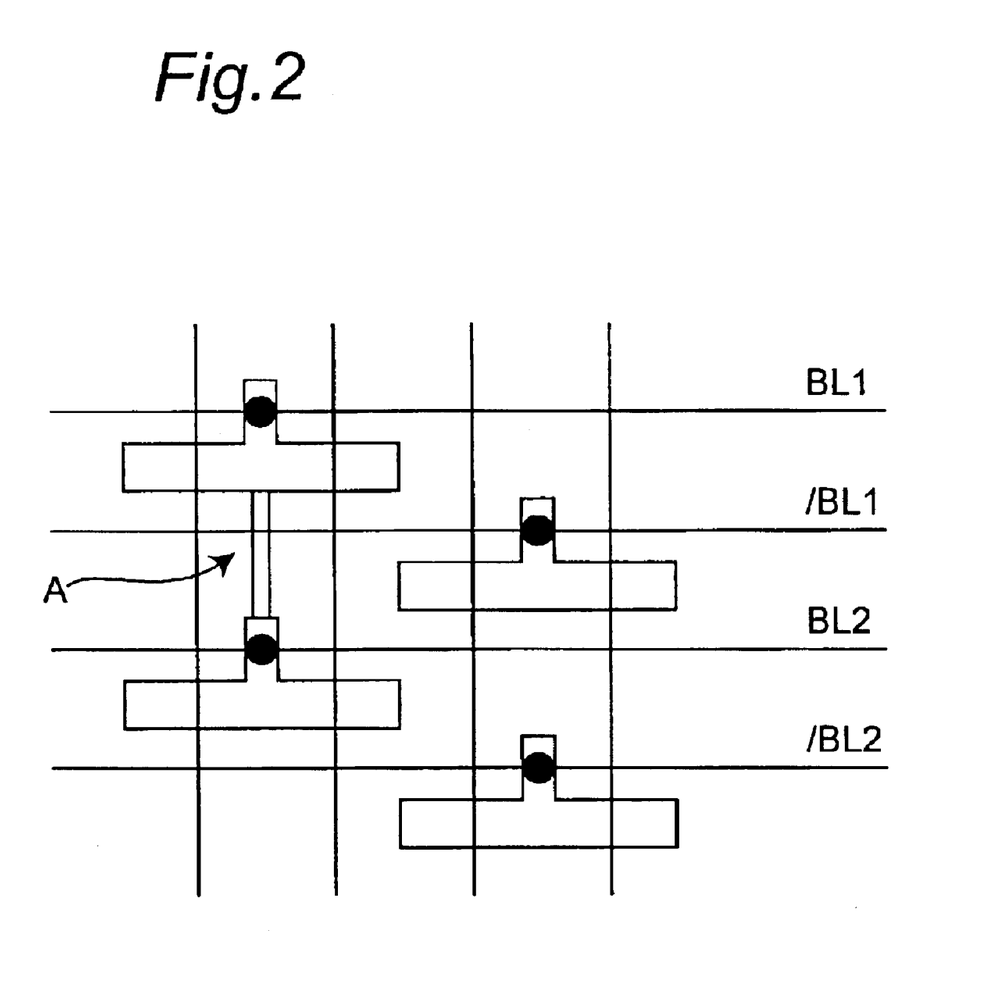
FIG. 2 is a view explanatory of operation of the semiconductor memory circuit of FIG. 1.

Furthermore, since the bit lines BL1, BL2, /BLI and /BL2 are, respectively, connected to the potentials VBL3, VBL2, VBL1 and VBL4 as described above, the bit lines BL1, BL2, /BL1 and /BL2 can also be, respectively, set to arbitrary potentials independently of each other. For example, if the potentials VBL1 and VBL3 are set to high level and the potentials VBL2 and VBL4 are set to low level, the bit lines BL1 and /BL1 are set to high level and the bit lines BL2 and /BL2 are set to low level. Therefore, it is possible to detect short circuit occurring between the bit lines BL1 and BL2 by skipping the bit line /BL1 due to defective field patterning as shown by the arrow A in FIG. 2.

In this embodiment, since a high potential difference can be applied between the bit line pair by forming the transistors Q1 of the bit line and sense amplifier interconnecting circuit BLI, the transistors Q2 of the bit line equalizing circuit BLEQ and the short-circuiting transistors Q3 of the short-circuiting transistor circuit 3 by the thick film transistors and transmission of a high potential of the bit lines to the sense amplifiers SA formed by the thin film transistors can be prevented by the bit line and sense amplifier interconnecting circuit BLI, burn-in voltage can be set high. A gate insulation film of the thick film transistor forming, e.g., the short-circuiting transistor Q3 has a thickness larger than that of the thin film transistor forming the sense amplifier SA (Second Embodiment)

Figure 3:
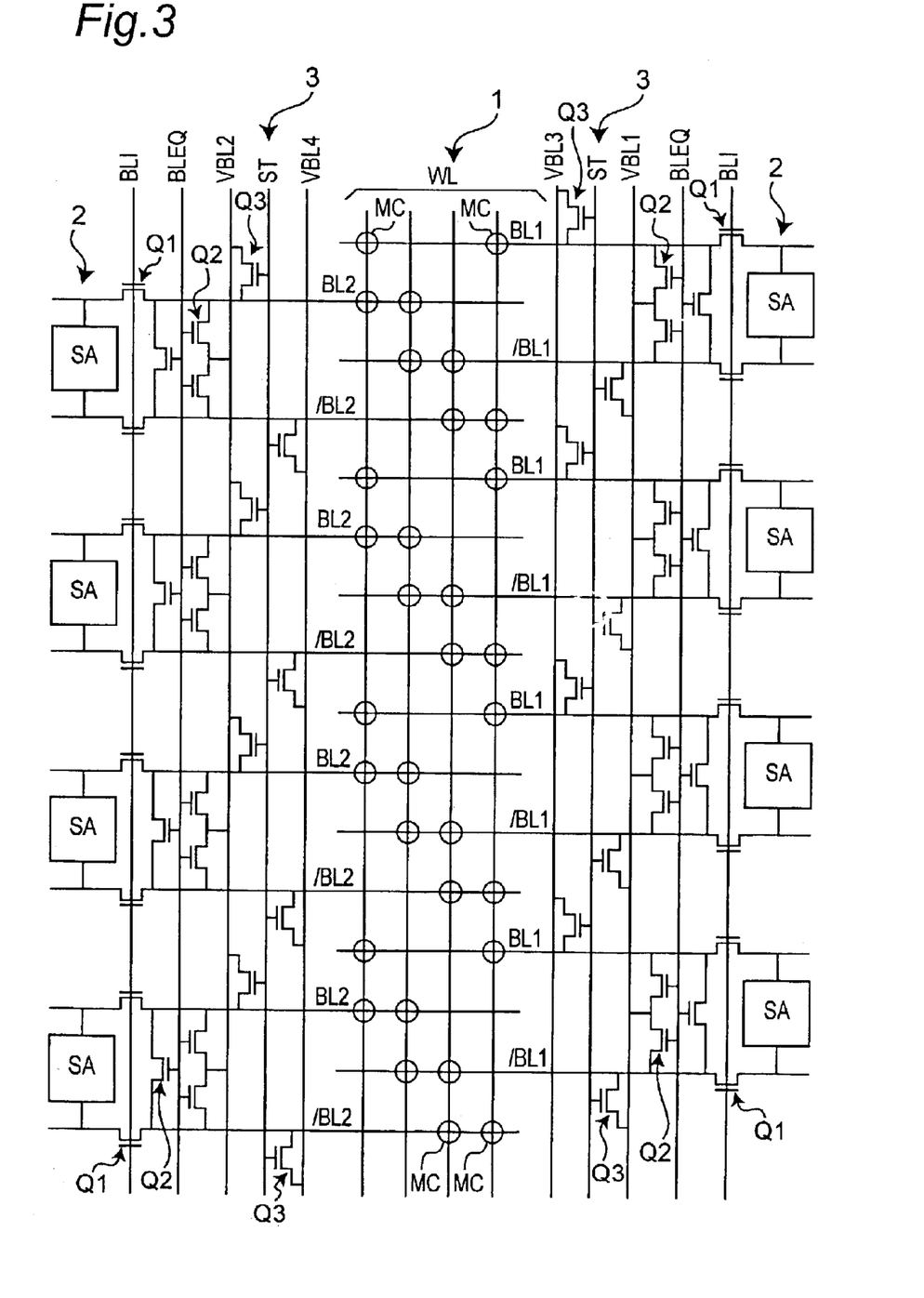
FIG. 3 is a circuit diagram showing a configuration of a semiconductor memory circuit according to a second embodiment of the present invention.

FIG. 3 shows a configuration of a semiconductor memory circuit having a normal operation and a burn-in test mode, according to a second embodiment of the present invention. In FIG. 3, the memory cell array 1 of this semiconductor memory circuit has a quarter pitch cell arrangement in which the bit line pair BL1 and /BL1 and the bit line pair BL2 and /BL2 are combined with each other telescopically in the direction of the word lines WL such that a plurality of sets each having the bit lines BL1, BL2, /BL1 and /BL2 arranged sequentially are repeated. Since other configurations of this semiconductor memory circuit are similar to those of the semiconductor memory circuit of FIG. 1, the description is abbreviated for the sake of brevity.

A burn-in test of the semiconductor memory circuit of FIG. 3 is also performed in the same manner as the semiconductor memory circuit of FIG. 1. For example, if the potentials VBL1 and VBL3 are set to high level and the potentials VBL2 and VBL4 are set to low level, the bit lines BL1 and /BL1 are set to high level and the bit lines BL2 and /BL2 are set to low level, so that the voltage stress can be applied among the neighboring bit lines BL1, BL2, /BL1 and /BL2.

Meanwhile, if the potentials VBL1 and VBL2 are set to high level and the potentials VBL3 and VBL4 are set to low level, the bit lines BL2 and /BL1 are set to high level and the bit lines BL1 and /BL2 are set to low level, so that the voltage stress can be applied between the bit lines BL1 and BL2 and between the bit lines /BL1 and /BL2.

In this embodiment, since a high potential difference can be applied between the bit line pair by forming the transistors Q1 of the bit line and sense amplifier interconnecting circuit BLI, the transistors Q2 of the bit line equalizing circuit BLEQ and the short-circuiting transistors Q3 of the short-circuiting transistor circuit 3 by the thick film transistors and transmission of a high potential of the bit lines to the sense amplifiers SA formed by the thin film transistors can be prevented by the bit line and sense amplifier interconnecting circuit BLI, burn-in voltage can be set high.

As is clear from the foregoing description, the semiconductor memory circuit having a normal operation mode and a burn-in test mode, according to the present invention includes the memory cell array which includes a plurality of the memory cells arranged in a matrix, a plurality of the bit lines provided in rows of the matrix and a plurality of the word lines provided in columns of the matrix, the first and second sense amplifier circuits which are, respectively, provided at opposite sides of the memory cell array in a direction of the bit lines and include a plurality of the first sense amplifiers each connected to the first bit line pair in the bit lines and a plurality of the second sense amplifiers each connected to the second bit line pair in the bit lines, respectively, the first and second bit line and sense amplifier interconnecting circuits for coupling the first and second bit line pairs to the first and second sense amplifier circuits, respectively, the first and second bit line equalizing circuits for setting the first and second bit line pairs to the first and second identical potentials, respectively during standby, the first short-circuiting transistor circuit for coupling the first and second potentials to the first bit line pair and the second short-circuiting transistor circuit for coupling the third and fourth potentials to the second bit line pair. The first bit line and sense amplifier interconnecting circuit, the first bit line equalizing circuit and the first short-circuiting transistor circuit are provided between the memory cell array and the first sense amplifier circuit, while the second bit line and sense amplifier interconnecting circuit, the second bit line equalizing circuit and the second short-circuiting transistor circuit are provided between the memory cell array and the second sense amplifier circuit such that the first and second short-circuiting transistor circuits are, respectively, disposed more adjacent to the memory cell array than the first and second bit line and sense amplifier interconnecting circuits are. Each of the first and second sense amplifiers is formed by a thin film transistor, while each of the first and second bit line and sense amplifier interconnecting circuits, the first and second bit line equalizing circuits and the first and second short-circuiting transistor circuits is formed by a thick film transistor.

Therefore, in accordance with the present invention, since a high potential difference can be applied between the bit line pair by forming the transistors of the bit line and sense amplifier interconnecting circuit, the transistors of the bit line equalizing circuit and the short-circuiting transistors of the short-circuiting transistor circuit by the thick film transistors and transmission of a high potential of the bit lines to the sense amplifiers formed by the thin film transistors can be prevented by the bit line and sense amplifier interconnecting circuit, burn-in voltage can be set high.

What is claimed is:

1. A semiconductor memory circuit having a normal operation mode and a burn-in test mode, comprising:
    a memory cell array which includes a plurality of memory cells arranged in a matrix, a plurality of bit lines provided in rows of the matrix and a plurality of word lines provided in columns of the matrix;
    first and second sense amplifier circuits which are, respectively, provided at opposite sides of the memory cell array in a direction of the bit lines and include a plurality of first sense amplifiers each connected to first bit line pair in the bit lines and a plurality of second sense amplifiers each connected to second bit line pair in the bit lines, respectively;
    first and second bit line and sense amplifier interconnecting circuits for coupling the first and second bit line pairs to the first and second sense amplifier circuits, respectively;
    first and second bit line equalizing circuits for setting the first and second bit line pairs to first and second identical potentials, respectively during standby;
    a first short-circuiting transistor circuit for coupling first and second potentials to the first bit line pair; and
    a second short-circuiting transistor circuit for coupling third and fourth potentials to the second bit line pair;
    wherein the first bit line and sense amplifier interconnecting circuit, the first bit line equalizing circuit and the first short-circuiting transistor circuit are provided between the memory cell array and the first sense amplifier circuit, while the second bit line and sense amplifier interconnecting circuit, the second bit line equalizing circuit and the second short-circuiting transistor circuit are provided between the memory cell array and the second sense amplifier circuit such that the first and second short-circuiting transistor circuits are, respectively, disposed more adjacent to the memory cell array than the first and second bit line and sense amplifier interconnecting circuits are; wherein each of the first and second sense amplifiers is formed by a first transistor having a first gate insulation film, while each of the first and second bit line and sense amplifier interconnecting circuits, the first and second bit line equalizing circuits and the first and second short-circuiting transistor circuits is formed by a second transistor having a second gate insulation film thicker than the first gate insulation film.

2. A semiconductor memory circuit according to claim 1, wherein the memory cell array has a half pitch cell arrangement in which the first and second bit line pairs are alternately provided in a direction of the word lines.

3. A semiconductor memory circuit according to claim 1, wherein the memory cell array has a quarter pitch cell arrangement in which the first and second bit line pairs are combined with each other telescopically in a direction of the word lines.

* * * * *